United States Patent
Kang et al.

(10) Patent No.: US 9,906,231 B2
(45) Date of Patent: Feb. 27, 2018

(54) CLOCK AND DATA RECOVERY CIRCUIT AND METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Tainan (TW); Yen-Chung Chen, Santa Clara, CA (US); Chen-Yang Pan, Taipei (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/843,988

(22) Filed: Sep. 2, 2015

(65) Prior Publication Data

US 2016/0112184 A1    Apr. 21, 2016

(30) Foreign Application Priority Data

Oct. 15, 2014  (TW) .............................. 103135667 A (51) Int. Cl.
| | |
|---|---|
| H04L 7/033 | (2006.01) |
| H03L 7/10 | (2006.01) |
| H04L 7/00 | (2006.01) |
| H04L 25/00 | (2006.01) |
| H03L 7/081 | (2006.01) |
| H03L 7/091 | (2006.01) |

(52) U.S. Cl.
CPC .............. *H03L 7/10* (2013.01); *H03L 7/0812* (2013.01); *H03L 7/091* (2013.01); *H04L 7/0083* (2013.01); *H04L 7/033* (2013.01); *H04L 25/00* (2013.01)

(58) Field of Classification Search
CPC ...................................................... H04L 7/0331
USPC .................................................. 375/354, 371
See application file for complete search history.

(56) References Cited

U.S. PATENT DOCUMENTS

| | | | |
|---|---|---|---|
| 5,027,085 A | 6/1991 | Devito | |
| 2009/0086872 A1* | 4/2009 | Liu | ........................ H03L 7/0814 375/371 |

(Continued)

FOREIGN PATENT DOCUMENTS

TW            201230691 A1    7/2012

*Primary Examiner* — Kevin M Burd
(74) *Attorney, Agent, or Firm* — CKC & Partners Co., Ltd.

(57) ABSTRACT

A clock and data recovery (CDR) circuit is provided, and includes a sampling circuit, an error sampler, a phase detect circuit, and a phase adjust circuit. The sampling circuit generates a data signal according to an input data and a first clock signal, and generates an edge signal according to the input data and a second clock signal. The error sampler compares the input data with a reference voltage according to the first clock signal to generate a control signal. The phase detect circuit receives the control signal and generates a corrective signal according to the data signal and the edge signal. When the values of the control signal and the data signal are different, the phase detect circuit stops transmitting the corrective signal. The phase adjust circuit generates and adjusts the first and the second clock signal according to the corrective signal.

10 Claims, 6 Drawing Sheets

(56) References Cited

U.S. PATENT DOCUMENTS

2010/0289544 A1* 11/2010 Lee .................. H04L 7/033
                                        327/159
2010/0309791 A1   12/2010 Fuller et al.
2011/0167297 A1    7/2011 Su et al.
2013/0294492 A1* 11/2013 Miao ................ H04L 7/0079
                                        375/232

* cited by examiner

CLOCK AND DATA RECOVERY CIRCUIT AND METHOD

This application claims priority to Taiwan Application Serial Number, 103135667, filed Oct. 15, 2014, which is herein incorporated by reference.

BACKGROUND

Technical Field

The present disclosure relates to an integrated circuit. More particularly, the present disclosure relates to a clock and data recovery circuit.

Description of Related Art

With rapidly development of manufacturing process, operation speed of an integrated circuit has been significantly improved. In a high-speed communication system, a clock and data recovery (CDR) circuit is commonly utilized for assuring that input data can be correctly read after being transferred.

Figure 1A:
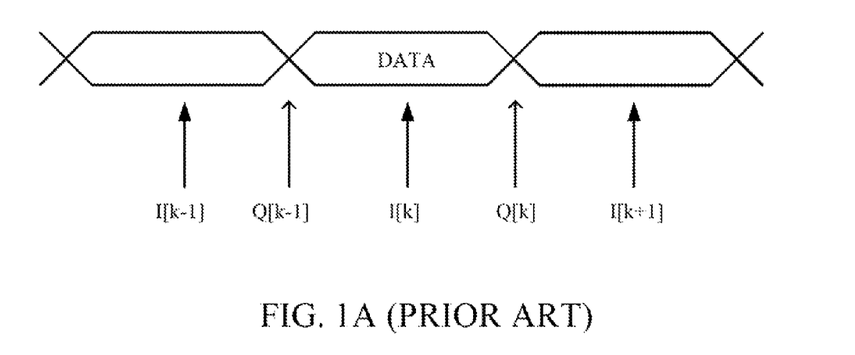
FIG. 1A is a schematic diagram illustrating a correct sampling operation on input data according to a conventional skill.

Reference is made to FIG. 1A. FIG. 1A is a schematic diagram illustrating a correct sampling operation on input data according to a conventional skill. A clock and data recovery circuit requires sampling a rising edge or a falling edge and a data value of input data transmitted from a transmitting end to perform subsequent operations for data recovery. For example, as shown in FIG. 1A, the clock and data recovery circuit is configured to sample the data value of the input data at sampling points I[k−1], I[k], and I[k+1], and to sample the rising edge or the falling edge of the input data at sampling points Q[k−1], Q[k], and Q[k+1]. Thus, the clock and data recovery circuit can perform operations of phase and frequency tracking correctly.

Figure 1B:
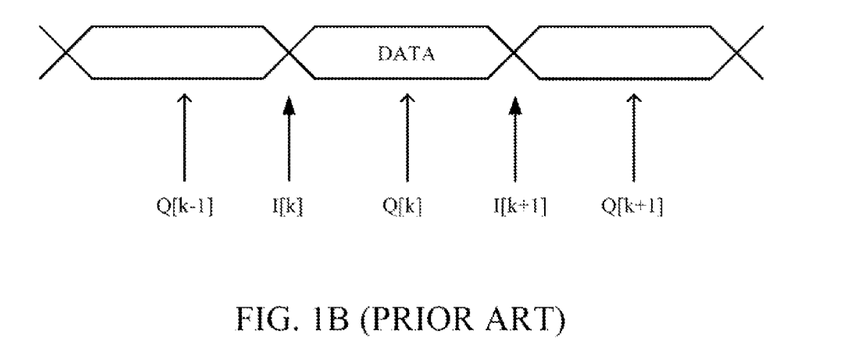
FIG. 1B is a schematic diagram illustrating an incorrect sampling operation on input data according to a conventional skill.

Reference is made to FIG. 1B. FIG. 1B is a schematic diagram illustrating an incorrect sampling operation on input data according to a conventional skill. With the increase of the data processing speed, signals transmitted through a transmitting channel have more and more attenuation, and thus the amplitude of the signals received by a receiving end becomes smaller. As a result, the signals received by the receiving end becomes sensitive to electromagnetic interference from a clock signal with a fixed frequency. Therefore, Spread-spectrum clocking (SSC) is now widely utilized in many systems to allow the frequency of the clock signal to be varied with time within a specific range. Since a frequency deviation caused by a system clock signal is up to 5000 part per million (PPM), when frequency deviation caused from the system clock signal is too large, a wrong sampling could be performed by the clock and data recovery circuit. For example, as shown in FIG. 1B, if the system clock signal is shifted due to process variation, or frequency deviation, etc, the clock and data recovery circuit may incorrectly sample the rising edge or the falling edge of the input data at sampling points I[k−1], I[k], and I[k+1] which should be configured to sample the data value of the input data DATA originally, and may incorrectly sample the data value of the input data DATA at sampling points Q[k−1], Q[k], and Q[k+1] which should be configured to sample the rising edge or the falling edge of the input data DATA originally. As a result, the clock and data recovery circuit are leaded to perform the frequency tracking toward a wrong direction, and the deviation between the clock signal and the data signal is increased.

Therefore, a heretofore-unaddressed need exists to address the aforementioned deficiencies and inadequacies.

SUMMARY

An aspect of the present disclosure is to provide a clock and data recovery circuit. The clock and data recovery circuit includes a sampling circuit, an error sampler, a phase detect circuit, and a phase adjust circuit. The sampling circuit is configured to generate a data signal according to an input data and a first clock signal, and to generate an edge signal according to the input data and a second clock signal. The error sampler is configured to compare the input data with a reference voltage to generate a control signal. The phase detect circuit is configured to receive the control signal, and to generate a corrective signal according to the data signal and the edge signal. When a value of the control signal is different from a value of the data signal, the phase detect circuit stops transmitting the corrective signal. The phase adjust circuit is configured to generate the first clock signal and the second clock signal, wherein the phase adjust circuit adjusts the first clock signal and the second clock signal according to the corrective signal.

Another aspect of the present disclosure is to provide a clock and data recovery circuit. The clock and data recovery circuit includes a sampling circuit, an error sampler, a phase detector, a loop filter, a determining circuit, and a phase adjust circuit. The sampling circuit is configured to generate a data signal and an edge signal according to an input data, a first clock signal, and a second clock signal. The error sampler is configured to compare the input data with a reference voltage according to the first clock signal to generate a control signal. The phase detector is electrically coupled to the sampling circuit, and is configured receive the data signal and the edge signal to generate an error signal. The loop filter is configured to generate a corrective signal according to the error signal. The determining circuit is electrically coupled between the phase detector and the loop filter, and is configured to selectively transmit the error signal to the loop filter according to the control signal. The phase adjust circuit is electrically coupled to the loop filter to receive the corrective signal, so as to generate the first clock signal and the second clock signal.

Another aspect of the present disclosure is to provide a clock and data recovery method. The clock and data recovery method includes following steps: sampling an input data according to a first clock signal and a second clock signal, respectively, to generate a data signal and an edge signal; detecting a phase difference between the data signal and the edge signal to generate an error signal; comparing the input data with a reference voltage to generate a control signal; transmitting the error signal to a loop filter to generate a corrective signal when a value of the control signal is the same as a value of the data signal, and adjusting the first clock signal and the second clock signal; and stopping transmitting the error signal to the loop filter when the value of the control signal is different from the value of the data signal to make the loop filter stop transmitting the corrective signal.

In summary, the clock and data recovery circuit and method of the present disclosure are able to timely detect whether an error sampling is caused, and to timely stop performing wrong operations of clock and data recovery. As a result, the reliability of the clock and data recovery circuit is increased, and the operation speed for frequency tracking of the clock and data recovery circuit is increased.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In this document, the term "coupled" may also be termed as "electrically coupled", and the term "connected" may be termed as "electrically connected". "Coupled" and "connected" may also be used to indicate that two or more elements cooperate or interact with each other.

Figure 2:
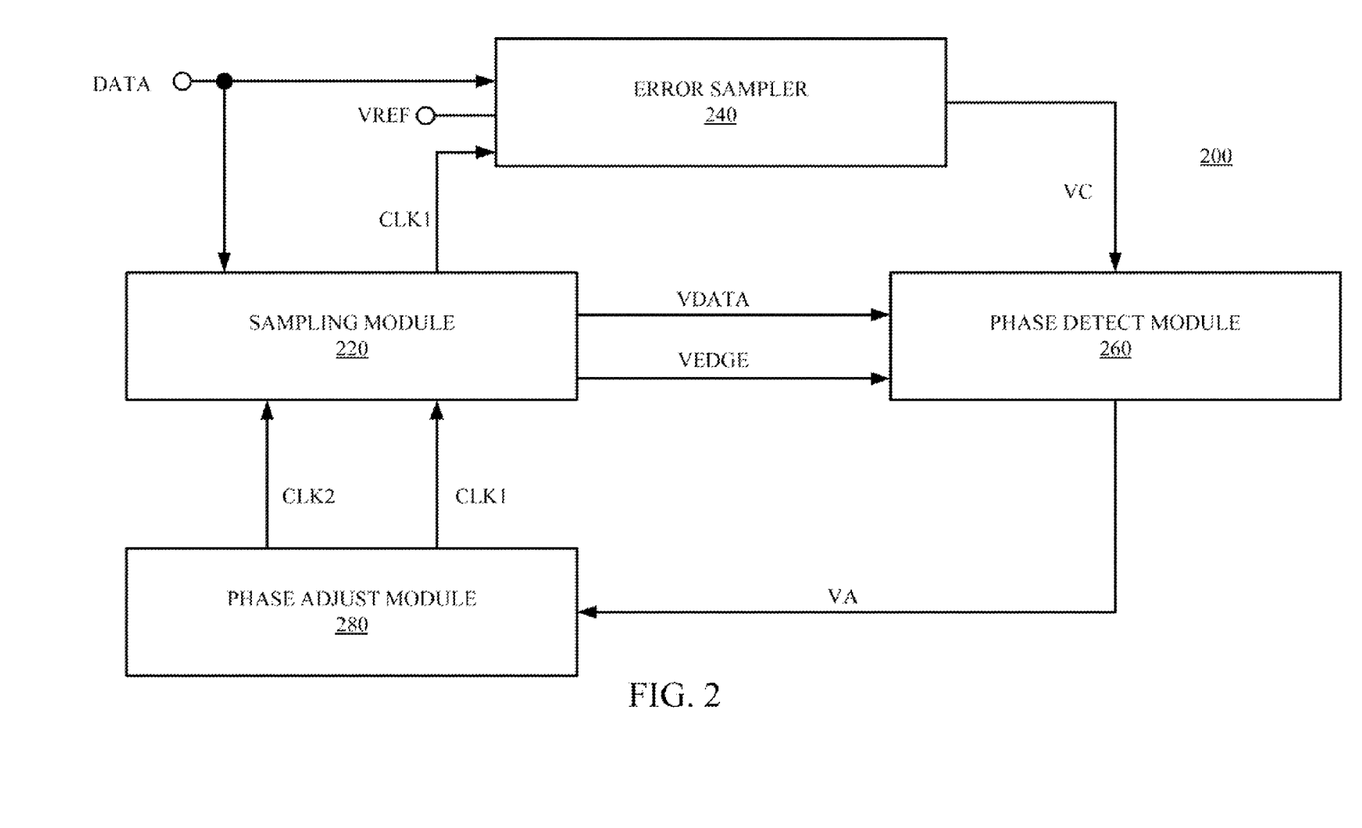
FIG. 2 is a schematic diagram of a clock and data recovery circuit according to one embodiment of the present disclosure.

Reference is made to FIG. 2. FIG. 2 is a schematic diagram of a clock and data recovery circuit 200, according to one embodiment of the present disclosure. As shown in FIG. 2, the clock and data recovery circuit 200 includes a sampling circuit 220, an error sampler 240, a phase detect circuit 260, and a phase adjust circuit 280.

The sampling circuit 220 is configured to generate a data signal VDATA according to a clock signal CLK1 and an input data DATA, and to generate an edge signal VEDGE according to a clock signal CLK2 and the input data VDATA. The error sampler 240 is configured to compare the input data DATA with a reference voltage VREF according to the dock signal CLK1, so as to generate a control signal VC. The phase detect circuit 260 is configured to receive the control signal VC, and to generate a corrective signal VA according to the data signal VDATA and the edge signal VEDGE. The phase adjust circuit 280 is configured to generate the clock signal CLK1 and the clock signal CLK2, and to adjust the frequency of the clock signal CLK1 and the frequency of the clock signal CLK2.

In various embodiments of the present disclosure, when a value of the control signal VC is different from a value of the data signal VDATA, the phase detect circuit 260 stops transmitting the corrective signal VA to the phase adjust circuit 280. With such operations, a wrong operation of frequency tracking, performed by the phase adjust circuit 280, can be avoided.

The following paragraphs provide certain embodiments related to the clock and data recovery circuit 200 to illustrate functions and applications thereof. However, the present disclosure is not limited to the following embodiments.

Figure 3A:
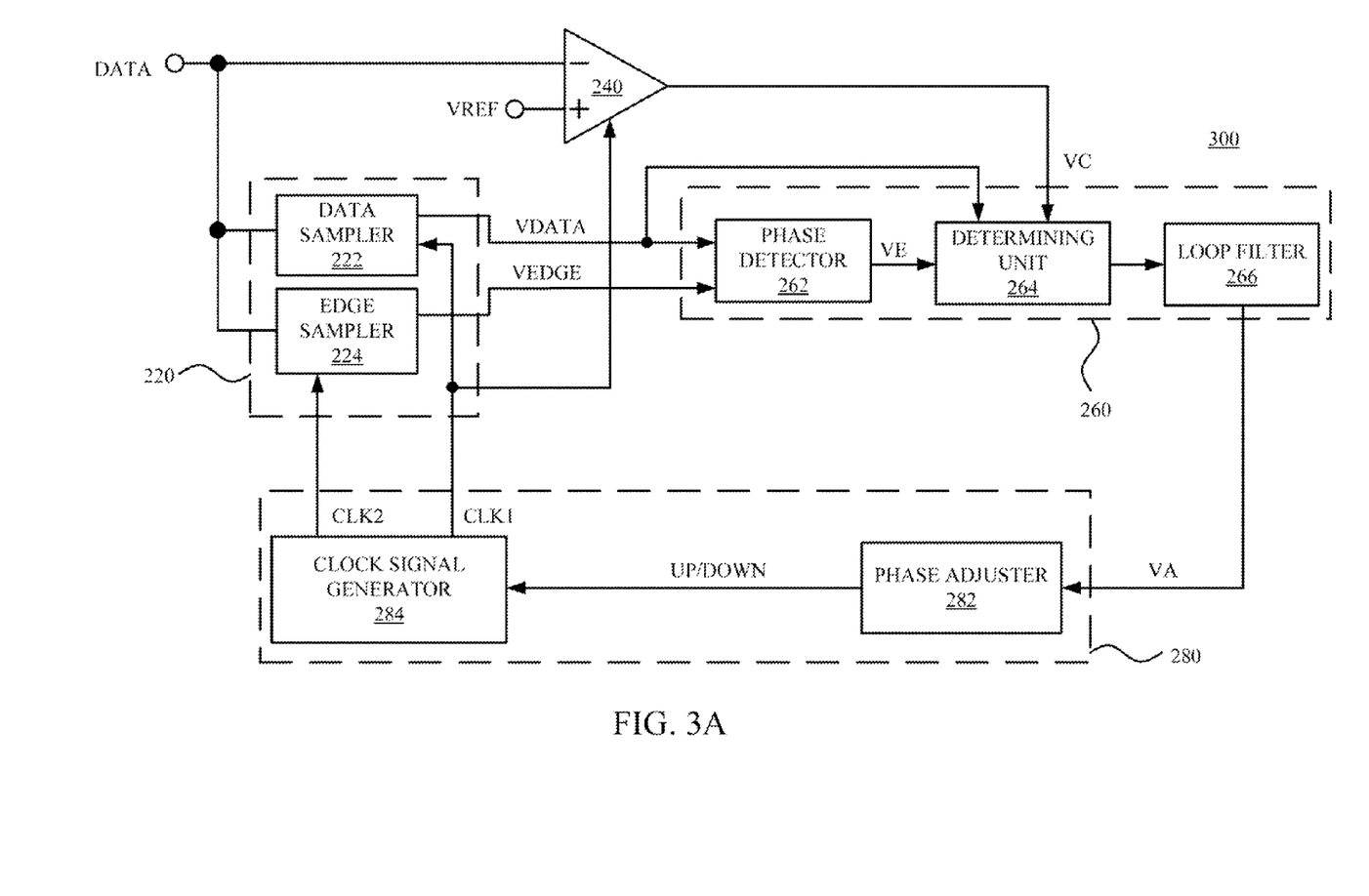
FIG. 3A is a schematic diagram of a clock and data recovery circuit according to one embodiment of the present disclosure.

Reference is made to FIG. 3A. FIG. 3A is a schematic diagram of a clock and data recovery circuit 300 according to one embodiment of the present disclosure. As shown in FIG. 3A, the sampling circuit 220 includes a data sampler 222 and an edge sampler 224. The data sampler 222 samples a data value of the input data DATA according clock signal CLK1 to generate the data signal VDATA. The edge sampler 224 samples a rising edge or a falling edge of the input data DATA according the clock signal CLK2 to generate the edge signal VEDGE. In practical applications, the clock signal CLK1 and the clock signal CLK2 are configured to be different in phase by 90 degrees.

Moreover, the phase adjust circuit 280 includes a phase adjuster 282 and a clock signal generator 284. The phase adjuster 282 is electrically coupled to the phase detect circuit 260, and generates an update signal UP/DOWN according to the corrective signal VA. In some embodiments, the phase adjuster 282 includes a phase interpolator that can generate different reference clock signals to the clock signal generator 284 according to the corrective signal VA. The clock signal generator 284 is electrically coupled to the phase adjuster 282, and is configured to generate the clock signal CLK1 and the clock signal CLK2. The clock signal generator 284 further adjusts the frequency or the phase of the clock signal CLK1 and the clock signal CLK2 to achieve operations of clock and data recovery.

Further, the phase detect circuit 260 includes a phase detector 262, a determining circuit 264, and a loop filter 266. The phase detector 262 is electrically coupled to the sampling circuit 220 to receive the data signal VDATA and the edge signal VEGDE. The phase detector 262 can compare the data signal VDATA with the edge signal VEDGE to detect the phase difference therebetween, so as to generate an error signal VE. The phase detector 262 can be any type of phase detector. For example, the phase can be a bang-bang phase detector. The type of the phase detector 262 is given for illustrative purposes only, and the present disclosure is not limited thereto. Person skilled in the art is able to choose another type of the phase detector according to the requirements of practical applications.

The determining circuit 264 is electrically coupled between the phase detector 262 and the loop filter 266, and is configured to selectively transmit the error signal VE to the loop filter 266 according to the control signal VC. After received the error signal VE, the loop filter 266 can generate the corrective signal VA according to the error signal VE.

Figure 3B:
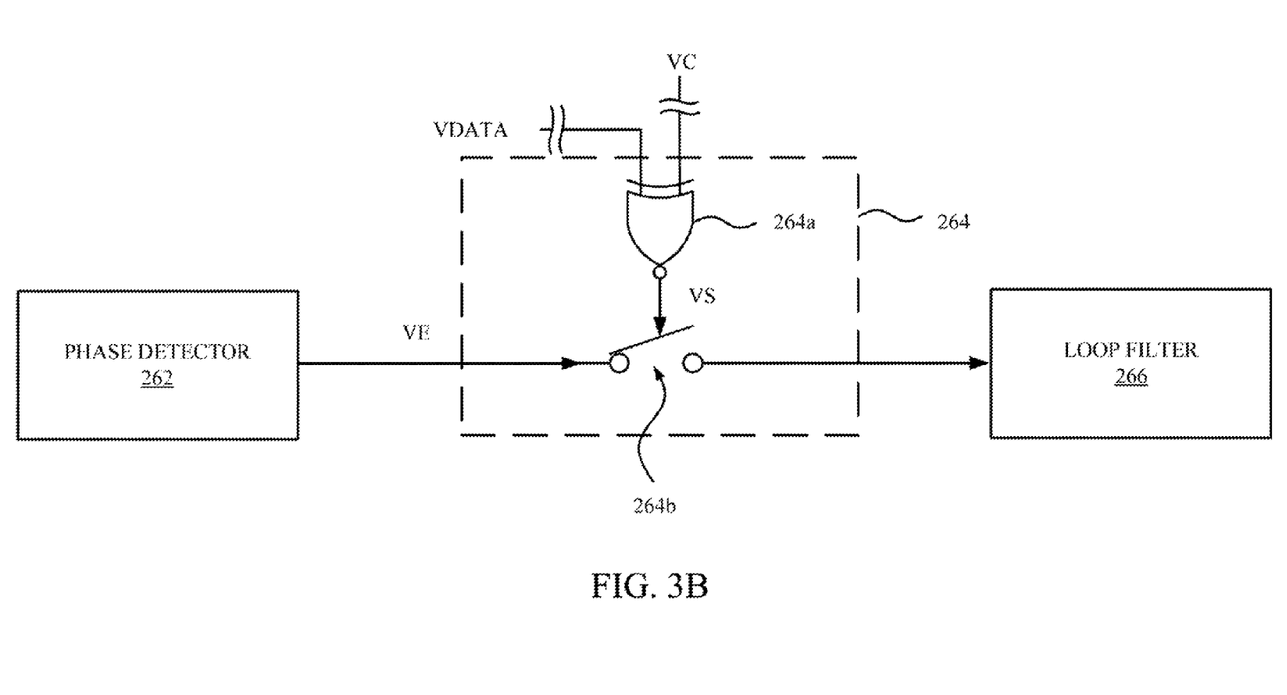
FIG. 3B is a schematic diagram of a determining circuit shown in FIG. 3A according one embodiment of the present disclosure

Reference is made to FIG. 3B. FIG. 3B is a schematic diagram of the determining unit 264 shown in FIG. 3A according one embodiment of the present disclosure. As shown in FIG. 3B, in one embodiment, the determining unit 264 includes an exclusive or (XOR) gate 264*a* and a switch 264*b*. The exclusive nor gate 264*a* is configured to receive the data signal VDATA and the control signal VC, and to generate a switching signal VS accordingly. The switch 264*b* is electrically couple between the phase detector 262 and the loop filter 266, and is selectively turned on according to the switching signal VS to transmit the error signal VE to the loop filter 266.

For example, when the value of the data signal VDATA is different from the value of the control signal VC, the exclusive nor gate 264 outputs a switching signal VS with a high voltage level, i.e., logic 1, to turn on the switch 264*b*. Thus, the phase detector 262 can transmit the error signal VE to the loop filter 266, so as to complete subsequent operations. The operations illustrated above are only for illustrative purposes, any type of the determining unit 264 that can perform the same or similar functions are within the contemplated scope of the present disclosure, and person skilled in the art can choose one of those according to the above descriptions.

Figures 4A, 4B:
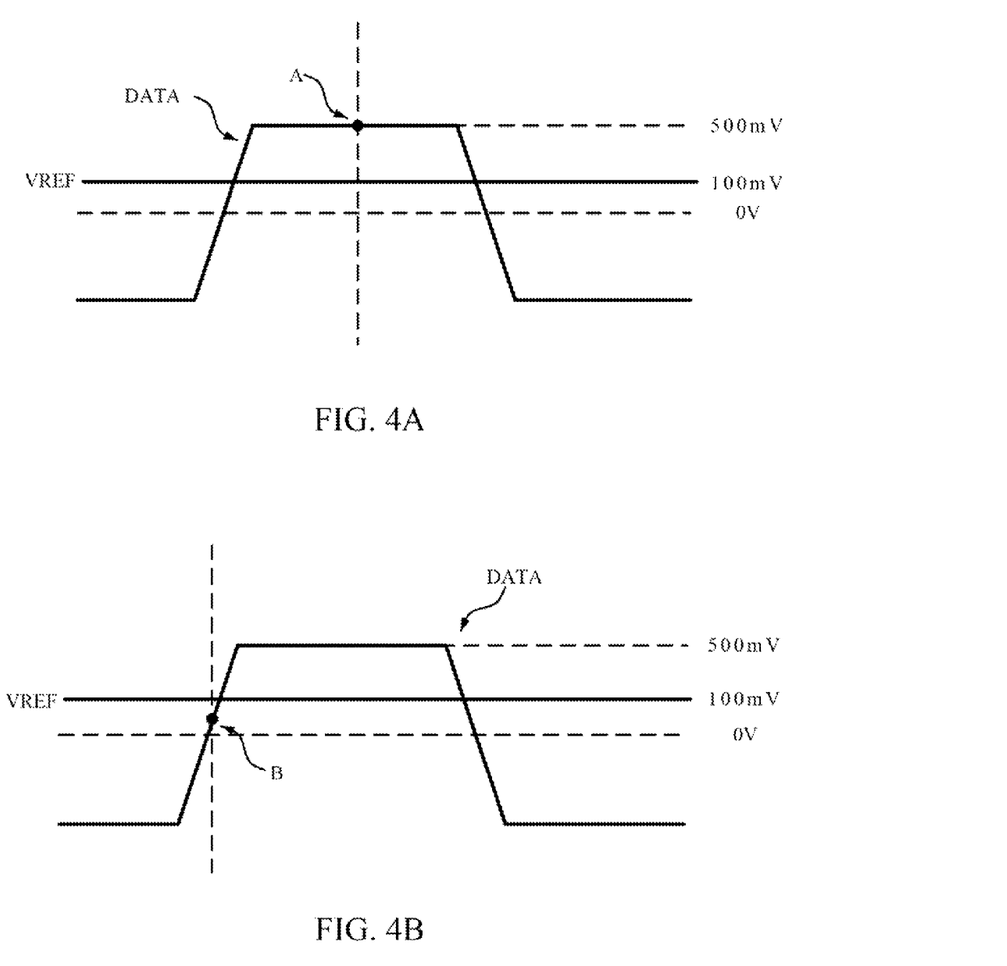
FIG. 4A is a waveform diagram illustrating a correct sampling operation performed by an error sampler shown in FIG. 3A according to one embodiment of the present disclosure.
FIG. 4B is a waveform diagram illustrating an incorrect sampling operation performed by the error sampler shown in FIG. 3A according to another one embodiment of the present disclosure.

Reference is made to both of FIG. 3A, FIG. 4A, and FIG. 4B. FIG. 4A is a waveform diagram illustrating a correct sampling operation performed by the error sampler 240 shown in FIG. 3A, according to one embodiment of the present disclosure. FIG. 4B is a waveform diagram illustrating an incorrect sampling operation performed by the error sampler 240 shown in FIG. 3A, according to another one embodiment of the present disclosure. In some embodiments, the error sampler 240 can be a comparator, which can compare the input data DATA with the reference voltage VREF according to the clock signal CLK1 (i.e., the same as the clock signal CLK1 received by the data sampler 222), so as to generate the control signal VC.

For example, as shown in FIG. 4A, the amplitude of the input data DATA is ±500 mill volts (mV), and the reference voltage VREF is configured to be about 100 mV. When the clock signal CLK1 is not shifted, the error sampler 240 samples the data value of the input data DATA at a sampling point A, i.e., the enabling period of the clock signal CLK1, in which the data value of the input data DATA is greater than the reference voltage VREF. Therefore, the error sampler 240 outputs the control signal VC with the high level voltage, i.e., logic 1. At the same time, the data sampler 222 also generates the data signal VDATA with the high level voltage, i.e., logic 1, according to the same clock signal CLK1 and the input data DATA. In other words, at this time, the value of the control signal VC is the same as the value of the data signal VDATA, the determining circuit 264 accordingly determines that the sampling circuit 220 samples the input data DATA correctly, and thus the switch 264*b* is turned on, so as to transmit the error signal VE to the loop filter 266 to complete the subsequent operations of frequency tracking.

The amplitude of the input data and the value of the reference voltage VREF are given only for illustrative purposes, and the present disclosure is not limited thereto. In some embodiments, the reference voltage is configured to be about 10-50% of the amplitude of the input data DATA, and is a value sufficient for a comparator to perform comparison.

Alternatively, as shown in FIG. 4B, it is assumed that the clock signal CLK1 is shifted due to process variations, and the error sampler 240 samples the rising edge of the input data at a sample point B. In this time, the sampled data value of the input data DATA is smaller than the reference voltage VREF, and thus the error sampler 240 outputs the control signal VC with a low level voltage, i.e., logic 0. Since the data value of the input data DATA sampled by the data sampler 222 is greater than a reference voltage level, 0 volt, the data sampler generates the data signal VDATA with the high level voltage, i.e., logic 1. Thus, the value of the control signal VC is different from the value of the data signal DATA, the determining circuit 264 accordingly determines that the sampling circuit 220 samples the input data DATA incorrectly, and thus the switch 264 is turned off, so as to stop the error signal VE transmitting to the loop filter 266.

With such configurations, when the sampling operations are incorrect, the wrong operations of frequency tracking performed by the phase adjust circuit 280 can be timely avoided. As a result, the reliability and the speed of frequency tracking of the clock and data recovery circuit 300 are improved.

It is noted that, in some embodiments, various elements of the clock and data recovery circuit 300 can be implemented using all-digital circuits. Therefore, the clock and data recovery circuit 300 has the advantage of easy design and low circuit variation, etc. Alternatively, in other embodiments, various elements of the clock and data recovery circuit 300 can be implemented through the combination of digital circuits and analog circuits, i.e., mixed signal circuits.

Figure 5:
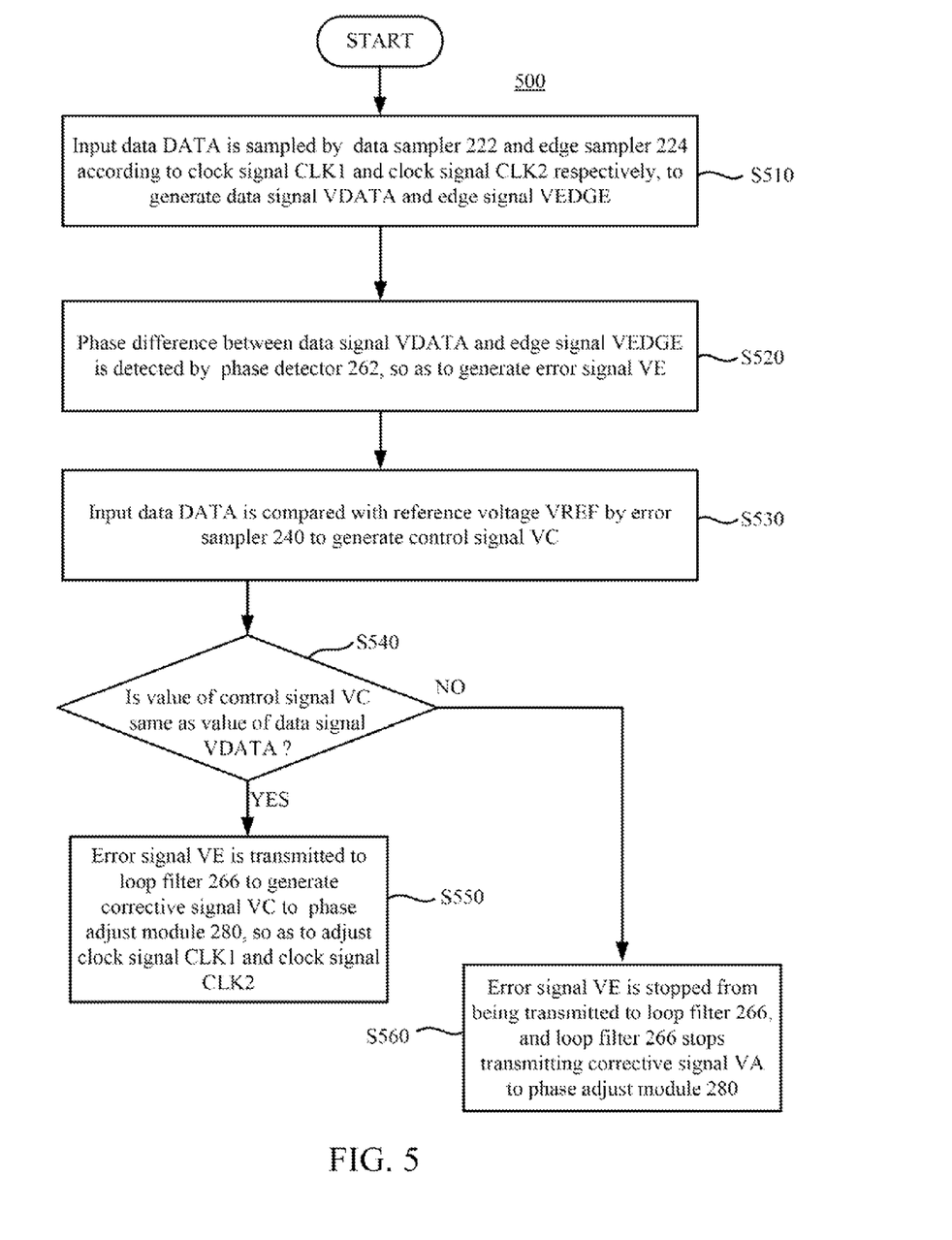
FIG. 5 is a flow chart of a clock and data recovery method according to one embodiment of the present disclosure.

Reference is made to FIG. 5. FIG. 5 is a flow chart of a clock and data recovery method 500 according to one embodiment of the present disclosure. For illustration, the operations of the clock and data recovery circuit 300 shown in FIG. 3 will be described with the clock and data recovery method 500. As shown in FIG. 5, the method 500 includes step S510, step S520, step S530, step S540, step S550, and step S560.

In step S510, the input data DATA is sampled by the data sampler 222 and the edge sampler 224 according to the clock signal CLK1 and the clock signal CLK2 respectively, to generate the data signal VDATA and the edge signal VEDGE.

In step S520, the phase difference between the data signal VDATA and the edge signal VEDGE is detected by the phase detector 262, so as to generate the error signal VE.

In step S530, the input data DATA is compared with the reference voltage VREF by the error sampler 240 to generate the control signal VC. For example, as shown in FIG. 4A, when the sampled data value of the input data DATA is greater than the reference voltage VREF, the error sampler generates the control signal VC with the high level voltage. Alternatively, as shown in FIG. 4B, when the sampled data value of the input data DATA is smaller than the reference voltage VREF, the error sampler generates the control signal VC with the low level voltage.

In step S540, it is determined whether the value of the control signal VC is the same as the value of the data signal VDATA by the determining circuit 264. If the value of the control signal VC is the same as the value of the data signal VDATA, step S550 is performed. Otherwise, if the value of the control signal VC is different from the value of the data signal VDATA, step S560 is performed.

For example, as shown in FIG. 3B, the corresponding switching signal VS can be generated, by the exclusive nor gate 264*a*, according to the value of the control signal VC and the value of the data signal VDATA. When the value of the control signal VC is the same as the value of the data signal VDATA, the exclusive nor gate 264*a* outputs the switching signal VS with the low level voltage. Alternatively, when the value of the control signal VC is different from the value of the data signal VDATA, the exclusive nor gate 264*a* outputs the switching signal VS with the high level voltage.

In step S550, the error signal VE is transmitted to the loop filter 266 to generate the corrective signal VC to the phase adjust circuit 280, so as to adjust the clock signal CLK1 and the clock signal CLK2.

In step S560, the error signal VE is stopped from being transmitted to the loop filter 266, and the loop filter 266 stops transmitting the corrective signal VA to the phase adjust circuit 280. For example, as shown in FIG. 3B, when the value of the control signal VC is different from the value of the data signal VDATA, the transferring path of the error signal VE is cut off by the switch 264*b*, and thus the loop filter 266 cannot generate an new corrective signal VA. With such configurations, wrong operations of frequency tracking performed by the phase adjust circuit 280 can be efficiently avoided.

In sum, the circuit and method of the present disclosure for clock and data recovery can timely detect whether an error sampling appears, and timely stop performing wrong operations of clock and data recovery. As a result, the reliability of the clock and data recovery circuit is increased, and the operation speed for frequency tracking of the clock and data recovery circuit is increased. It will be apparent to those skilled in the art that various modifications and variations can be made to the structure of the present disclosure without departing from the scope or spirit of the invention. In view of the foregoing, it is intended that the present disclosure cover modifications and variations of this disclosure provided they fall within the scope of the following claims.

What is claimed is:

1. A clock and data recovery circuit, comprising:
   a sampling circuit configured to generate a data signal according to an input data and a first clock signal, and to generate an edge signal according to the input data and a second clock signal;
   an error sampler comprising a comparator that is configured to compare the input data with a first reference voltage to generate a control signal according to the first clock signal;
   a phase detect circuit configured to receive the control signal, the data signal and the edge signal, and to generate a corrective signal according to the data signal, the edge signal and the control signal; and
   a phase adjust circuit configured to generate the first clock signal and the second clock signal, wherein the phase adjust circuit adjusts the first clock signal and the second clock signal according to the corrective signal,
   wherein the phase detect circuit further comprises:
      a phase detector configured to detect a phase difference between the data signal and the edge signal to generate an error signal;
      a loop filter configured to generate the corrective signal according to the error signal; and
      a determining circuit configured to receive the error signal, and to determine whether or not to transmit the error signal to the loop filter according to the control signal and the data signal, wherein when the determining circuit determines that a value of the control signal is different from a value of the data signal, the determining circuit stops transmitting the error signal,
   wherein the input data is compared with the first reference voltage to identify the value of the control signal according to the first clock signal, and the input data is compared with a second reference voltage to identify the value of the data signal according to the first clock signal, wherein the first reference voltage is larger than the second reference voltage, wherein the determining circuit comprises: an exclusive nor gate configured to generate a switching signal according to the control signal and the data signal; and a switch configured to selectively transmit the error signal to the loop filter according to the switching signal.

2. The clock and data recovery circuit of claim 1, wherein the sampling circuit comprises:
   a data sampler configured to sample the input data according to the first clock signal to generate the data signal; and
   an edge sampler configured to detect a rising edge and a falling edge of the input data according to the second clock signal to generate the edge signal.

3. The clock and data recovery circuit of claim 1, wherein the phase adjust circuit comprises:
   a phase adjuster configured to generate an update signal according to the corrective signal; and
   a clock signal generator configured to generate the first clock signal and the second clock signal, and to adjust the first clock signal and the second clock signal according to the update signal.

4. The clock and data recovery circuit of claim 1, wherein the reference voltage is configured to be about 10-50% of the maximum amplitude of the input data.

5. The clock and data recovery circuit of claim 1, wherein the phase detector includes a bang-bang phase detector.

6. A clock and data recovery circuit, comprising:
   a sampling circuit configured to generate a data signal and an edge signal according to an input data, a first dock signal, and a second clock signal;
   an error sampler comprising a comparator that is configured to compare the input data with a first reference voltage according to the first clock signal to generate a control signal;
   a phase detector electrically coupled to the sampling circuit, and configured to receive the data signal and the edge signal to generate an error signal;
   a loop filter configured to generate a corrective signal according to the error signal;
   a determining circuit electrically coupled between the phase detector and the loop filter, and configured to selectively transmit the error signal to the loop filter according to the control signal and the data signal, wherein when a value of the control signal is different from a value of the data signal, the determining circuit stops transmitting the error signal to the loop filter; and
   a phase adjust circuit electrically coupled to the loop filter to receive the corrective signal, so as to generate the first clock signal and the second clock signal,
   wherein the input data is compared with the first reference voltage to identify the value of the control signal according to the first clock signal, and the input data is compared with a second reference voltage to identify the value of the data signal according to the first clock signal, wherein the first reference voltage is larger than the second reference voltage, wherein the determining circuit comprises: an exclusive nor gate configured to receive the data signal and the control signal to generate a switching signal; and a switch electrically coupled between the phase detector and the loop filter to selectively transmit the error signal to the loop filter according to the switching signal.

7. The clock and data recovery circuit of claim 6, wherein the reference voltage is configured to be about 10-50% of the maximum amplitude of the input data.

8. A clock and data recovery method, comprising:
respectively sampling an input data according to a first clock signal and a second clock signal to generate a data signal and an edge signal;
detecting, by a phase detector, a phase difference between the data signal and the edge signal to generate an error signal;
comparing, by a comparator, the input data with a first reference voltage to generate a control signal according to the first clock signal;
transmitting the error signal to a loop filter to generate a corrective signal by a determining unit when the determining unit determines a value of the control signal is the same as a value of the data signal, and adjusting the first clock signal and the second clock signal; and
stopping transmitting the error signal to the loop filter when the value of the control signal is different from the value of the data signal to make the loop filter stop transmitting the corrective signal,
wherein the input data is compared with the first reference voltage to identify the value of the control signal according to the first clock signal, and the input data is compared with a second reference voltage to identify the value of the data signal according to the first clock signal, wherein the first reference voltage is larger than the second reference voltage, wherein the step of generating the corrective signal comprises: transmitting the control signal and the data signal to an exclusive nor gate to generate a switching signal; and selectively transmitting the error signal to the loop filter according to the switching signal.

9. The clock and data recovery method of claim 8, wherein the error signal is generated by a phase detector, and the step of selectively transmitting the error signal comprises:
selectively turning on a switch to transmit the error signal to the loop filter according to the switching signal, wherein the switch is electrically coupled between the phase detector and the loop filter.

10. The clock and data recovery method of claim 8, wherein the reference voltage is configured to be about 10-50% of the maximum amplitude of the input data.

* * * * *